United States Patent [19]

Keate et al.

[11] Patent Number: 5,111,155
[45] Date of Patent: May 5, 1992

[54] DISTORTION COMPENSATION MEANS AND METHOD

[75] Inventors: Christopher R. Keate; Sergio Aguirre, both of Chandler; Brian L. Stockdell, Mesa, all of Ariz.

[73] Assignee: Motorola, Inc., Schaumburg, Ill.

[21] Appl. No.: 663,522

[22] Filed: Mar. 4, 1991

[51] Int. Cl.$^5$ .............................................. H03F 1/32
[52] U.S. Cl. ....................................... 330/149; 375/57
[58] Field of Search ................ 328/155; 330/107, 149; 332/103, 104, 105; 375/52, 57

[56] References Cited

U.S. PATENT DOCUMENTS 4,462,001  7/1984  Girard .................................. 330/149

Primary Examiner—Steven Mottola
Attorney, Agent, or Firm—Robert M. Handy

[57] ABSTRACT

Distortion introduced in phase modulated RF signals by amplifiers and other signal processors is substantially reduced by modifying complex modulating signals I,Q in a way that compensates for the amplifier phase error $\phi_e$ as a function of amplifier power P. In a preferred embodiment, I, Q are combined to calculate the amplifier power level and scaled by a parameter, e.g., $K1 = -d\phi_e/dP$, to provide factor B so that compensated signals $I'' = AQ + BI$ and $Q'' = AI - BQ$, where A is a constant, can be determined. When an RF carrier modulated by $I''$, $Q''$ is passed through the distorting amplifier the amplifier induced distortion is cancelled. Substantial reduction in bit error probability is obtained. The method can also be used for post-distortion correction.

11 Claims, 5 Drawing Sheets

DISTORTION COMPENSATION MEANS AND METHOD

FIELD OF THE INVENTION

The present invention concerns an improved means and method for compensation of electronic equipment for predictable distortion, as for example, compensation of predictable distortion in high frequency amplifiers and/or signal processors.

BACKGROUND OF THE INVENTION

The presence of distortion in high frequency amplifiers or signal processors is difficult to avoid and can cause substantial degradation in overall system performance. This is particularly true when travelling wave tube (TWT) amplifiers and high powered radio frequency (HPRF) amplifiers are utilized for amplification and/or processing of coherent communication signals.

For example, non-linearities in the transfer characteristics of TWT and/or HPRF amplifiers can severely distort phase modulated waveforms. Phase-shift keying (PSK) and quadrature amplitude modulation (QAM) are well known phase modulation techniques. Variations in phase and/or amplitude arising from non-linear amplifier transfer characteristic have the affect of decreasing the effective signal to noise ratio in the amplified signal, whether in a transmitter or receiver or both, i.e., the data error rate increases.

Various signal correction methods have been tried in the past. For example, FIG. 1 shows a schematic representation of prior art adaptive, digital, pre-distortion linearized amplifier system 10 employing non-linear radio frequency amplifier 12. This prior art system is described in greater detail by A. A. M. Saleh et al., in "Adaptive Linearization of Power Amplifiers in Digital Radio", *Bell System Technical Journal*, Vol. 62, Apr. 1983, pages 1019-1033, so only a brief explanation is provided here.

Digital input data 14 embodying the information desired to be modulated onto a carrier, amplified and transmitted is provided to memory look-up encoder 16 and linearizing processor 18. Lookup encoder 16 provides a transformation between the incoming digital data stream and the bit stream later used, via random access memory (RAM) 20 and D/A converter 22, to provide in-phase signal I and quadrature signal Q to quadrature modulator 24 which in turn generates modulated RF signal 26 to power amplifier 12 which provides amplified modulated RF signal 27 to directional coupler (DC) or splitter 28 and modulated RF signal 30 to an antenna. The RF carrier is supplied by local oscillator 32. In FIG. 1 (and FIG. 6), heavy solid lines indicate digital signal paths, light solid lines indicate analog signal paths and dashed lines indicate RF signal paths.

Portion 34 of amplified modulated RF signal 27 is obtained from splitter 28 from whence it flows to quadrature demodulator 36 where it is demodulated and the analog output fed to A/D converter 38 to provide a bit stream analogous to that which was supplied to D/A converter 22 but now modified according to the distortion introduced by amplifier 12. This feed back digital signal is compared in linearizing processor 18 with incoming bit stream 14 and used to modify the bits stored in RAM 20 which are sent to D/A converter 22 to drive modulator 26 and amplifier 12 so that the difference between fed-back digital signal 39 and incoming digital signal 14 is minimized. In summary, incoming signal 14 is pre-distorted by providing in RAM 20 additional bits corresponding to the distortion introduced by amplifier 12 so that the resulting information contained on modulated RF output 30 is substantially un-distorted, i.e., the pre-distortion added to the signal to be amplified is such as to substantially compensate for the distortion introduced by amplifier 12. An advantage of the system of FIG. 1 is that the exact form of the distortion introduced by amplifier 12 need not be known in advance since the system is adaptive.

While the system illustrated in FIG. 1 provides improved system performance as compared to amplifier 12 alone, it is complex and expensive to implement and, depending on the data rate and RF carrier frequency, may consume more power than can be conveniently provided, particularly in satellite applications. A further difficulty is that the arrangement of FIG. 1 is inherently slow, being limited by, among other things, the RAM read/write times. It is extremely difficult if not impossible with such an approach to provide real time, error corrected, signal processing and/or amplifying systems that operate with signalling rates approaching 100 MegaHertz or higher.

Accordingly, there is a continuing need for improved electronic signal processing apparatus, as for example, RF amplifying systems operating typically in the range 5-10 GigaHertz or higher that provide reduced distortion in a less complex, more economical and/or more power efficient manner and which can operate at high data rates. This is especially important in connection with satellite based, coherent (i.e., phase synchronized) RF systems where weight and power consumption are especially critical and high data rates are desired.

SUMMARY OF THE INVENTION

It is a feature of the present invention to provide an improved means and method for compensating inherent distortion in a signal processing apparatus, as for example but not limited to, an RF amplifying apparatus, including apparatus for amplifying a phase modulated coherent RF signal.

The forgoing and other features and advantages are provided by an apparatus comprising in combination, first signal processing means providing a first output signal (I') proportional to a first input signal (I) being provided thereto, second signal processing means providing a second output signal (Q') proportional to a second input signal (Q) being provided thereto, third signal processing means coupled to outputs of the first and second signal processing means for providing a third output signal (B) proportional to the sum of the first (I') and second (Q') output signals, and fourth signal processing means receiving the first (I) and second (Q) input signals and the third output signal (B) and a fourth signal (A) and producing a fifth output signal (Q") proportional to (AI−BQ) and a sixth output signal (I") proportional to (AQ+BI). In a typical implementation, the first (I) and second (Q) input signals are complex signals, having predetermined amplitude and phase, and substantially in quadrature.

In a preferred implementation the apparatus further comprises modulating means for modulating the fifth (I") and sixth (Q") output signals onto a carrier provided by a local oscillator or other RF signal generator coupled to the modulating means. Quadrature Phase Shift Keying (QPSK or 4PSK) and Octal Phase Shift Keying (OPSK or 8PSK) are examples of preferred modulation techniques, but higher order (e.g., 16PSK, 32PSK, etc.) and/or other modulation techniques (e.g., QAM) may also be used. The examples provided are for purposes of illustration and not intended to be limiting.

The third signal processing means conveniently comprises a first summing means for adding the first (I') and second (Q') output signals to provide a summed output (S) and a signal processing means for receiving the summed output (S) and producing the third output signal (B) proportional to the summed output (S). The first and second signal processing apparatus conveniently comprise means for determining the amplitudes of the first (I) and second (Q) input signals, as for example, multipliers for producing signals proportional to the square of (I) and (Q).

Compensation of an amplifying and/or signal processing means having inherent internal distortion is preferably accomplished by the method of obtaining the sum (S) of first (I') and second (Q') real values proportional to the amplitudes of first (I) and second (Q) complex input signals, adjusting the value of the sum (S) by an amount dependent on a factor (K) proportional to the phase distortion introduced by an amplifying means, to obtain an amplitude dependent distortion factor (B), providing a reference signal (A), and complex multiplying and summing the first (I) and second (Q) input signals and the distortion factor (B) and the reference signal (A) to provide first (I'') and second (Q'') complex (e.g., quadrature) output signals given by (I'')=(AQ+BI) and (Q'')=(AI−BQ).

It is desirable to use the first (I'') and second (Q'') complex output signals to modulate an RF carrier. The adjusting step conveniently includes obtaining (B)=(K)x(S) and, after modulation, passing the modulated RF carrier through the amplifying means, wherein K=−K'. For typical TWT amplifiers K' is proportional to $d(\phi_e)/d(P)$ or $d(\phi_e)/d(\log P)$ depending upon the operating range of the amplifier, where ($\phi_e$) is the amplifier phase error and (P) is the amplifier power.

In a preferred embodiment, the step of obtaining the sum (S) includes multiplying the first (I) input signal by itself and multiplying the second (Q) input signal by itself to obtain the first (I') and second (Q') real values and then summing the first (I') and second (Q') real values to obtain the sum (S).

DETAILED DESCRIPTION OF THE DRAWINGS

Figure 1:
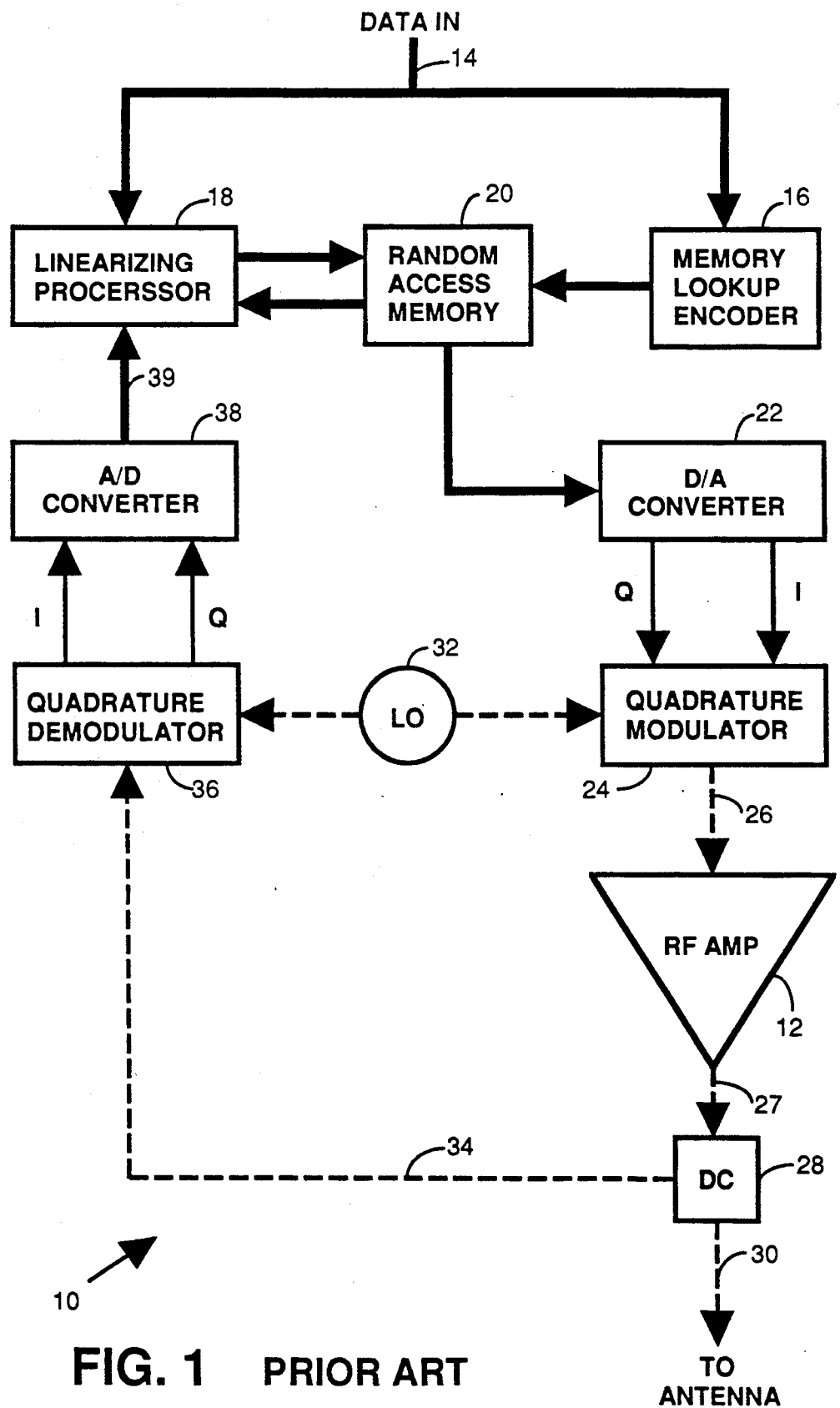
FIG. 1 is a simplified block diagram of an adaptive, digital, pre-distortion linearizer according to the prior art.
Figure 2A:
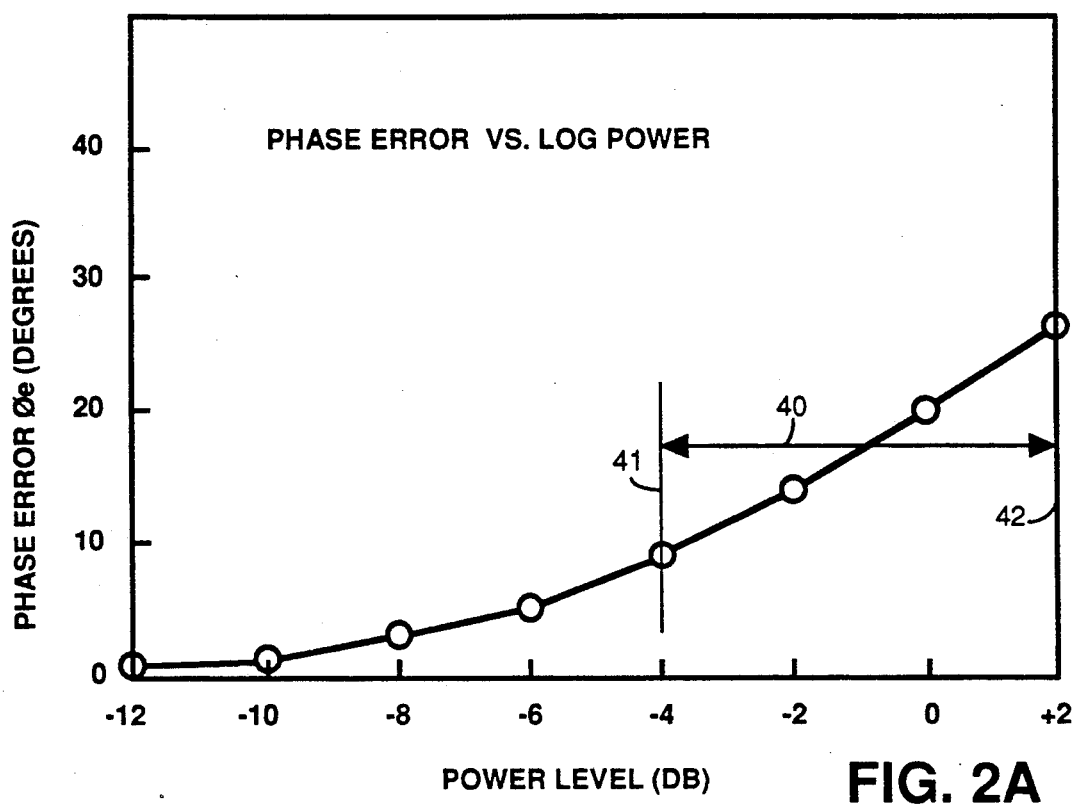
FIGS. 2A-B are a simplified plots of the phase error ($\phi_e$) of a typical RF amplifying apparatus on the ordinate as a function of the amplifier power level (P) on the abscissa expressed in db (i.e., log power) in FIG. 2A and in watts in FIG. 2B.
Figure 2B:
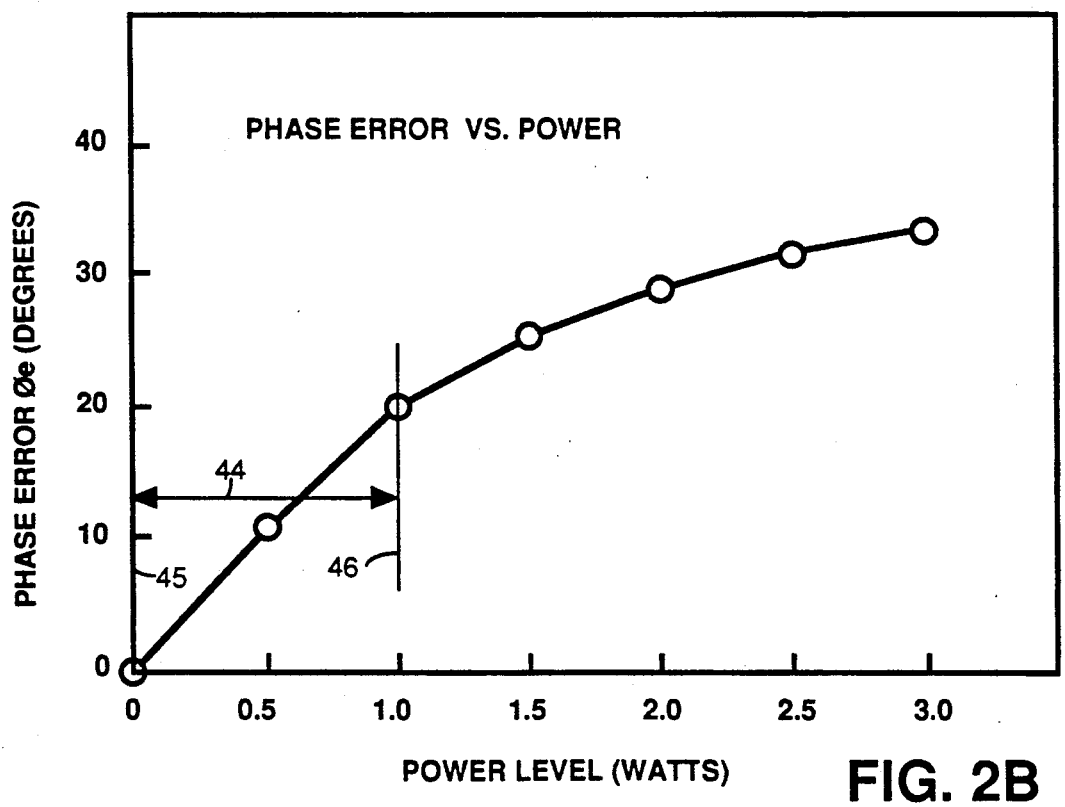

FIGS. 2A-B show plots of phase error ($\phi_e$) versus amplifier power level of a typical 100 Watt TWT amplifier manufactured by GM Hughes Electronics of Torrance, Calif., operating at 14-18 GigaHertz. The ordinate shows the phase shift, i.e., the "phase error" ($\phi_e$) measured in degrees, of the output signal compared to the input signal as a function of the amplifier power level (P), in this case the input signal power level.

In FIG. 2A the power level is measured in decibels (db) and in FIG. 2B in watts. Zero db on the abscissa of FIG. 2A corresponds to about 20 db amplifier gain. As the input signal power level is increased or decreased the total power output of the amplifier increases and decreases substantially in direct proportion thereto up to the saturation power level of the amplifier.

In FIG. 2A, the phase error is about proportional to the amplifier power level (P) expressed in db. i.e., $\phi_e \approx C_1 \log(P)$ where $C_1$ is a constant, over a substantial range 40 of power levels between the vertical lines 41, 42. In FIG. 2B, the phase error is about proportional to the power level (P) expressed in watts, i.e., $\phi_e \approx C_2(P)$ where $C_2$ is another constant, over a range 44 of power levels between vertical lines 45, 46. Thus, the desired amplifier operating range determines which ($\phi_e$) versus (P) relationship should be used, that is, linear or log or some other relationship that can be readily determined by those of skill in the art based on the amplifier or signal processor phase-error versus power characteristics.

Figure 3A:
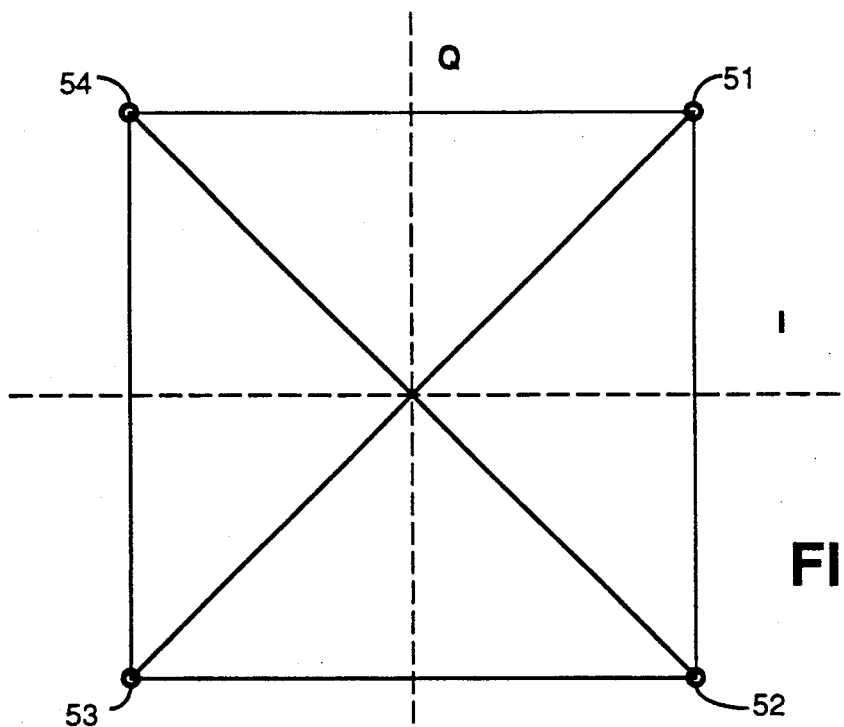
FIGS. 3A-B are simplified constellation plots of QPSK modulated signals without (FIG. 3A) and with (FIG. 3B) phase error.
Figure 3B:
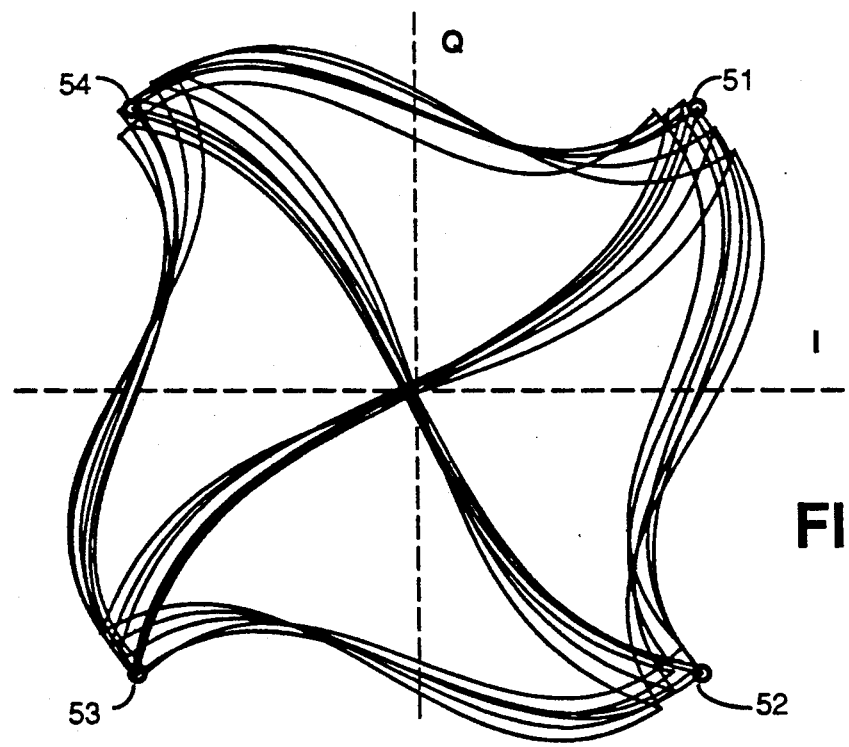

The effect of this phase error is shown schematically in FIGS. 3A-B in what are known in the art as "constellation" plots of a phase modulated waveform in which the abscissa represents the in-phase signal (I) of the complex waveform and the ordinate represents the quadrature signal (Q). FIGS. 3A-B are for a QPSK waveform, that is, one in which the modulated waveform ideally assumes any one of four phase values at, for example, 45°, 135°, 225°, and 315° degrees as indicated, respectively, by dots 51, 52, 53, 54. The vertical, horizontal and diagonal lines extending between the dots represent the transitions between any of the four possible phase values.

FIG. 3A represents the ideal situation when there is no phase error and the quadrature modulation results in exactly the phase angles represented by dots 51-54. The time dependent phase modulated signal E(t) illustrated in FIG. 3A may be expressed as:

$$E(t) = [A]e^{j\phi_m}$$
$$= [A](\cos \phi_m + j \sin \phi_m)$$

where
$\phi_m$ is the phase modulation,
$\phi_m = \tan^{-1}(Q/I)$, and where
$[A] = (I^2 + Q^2)^{\frac{1}{2}}$
is the absolute value of the signal amplitude and I and Q are the in-phase and quadrature components of the complex signal.

FIG. 3B shows the situation where dynamic phase error is present, as for example, from phase error $\phi_e$ introduced by instantaneous fluctuations in power level P of the amplifier of FIG. 2A-B. The phase modulated signal illustrated in FIG. 3B may be expressed as:

$$E(t)' = [A]e^{j(\phi_m + \phi_e)}$$
$$= [A](\cos(\phi_m + \phi_e) + j\sin(\phi_m + \phi_e)).$$

where $\phi_m$ is the phase modulation,
$\phi_e$ is the phase error,
$\phi_m + \phi_e = \tan^{-1}(Q/I)$, and where
$[A] = (I^2 + Q^2)^{\frac{1}{2}}$ is the absolute value of the signal amplitude and I and Q are the in-phase and quadrature components of the complex signal.

The phase modulation constellation becomes distorted and the instantaneous phase values no longer correspond to the ideal values represented by dots 51-54. The larger the power swings, the larger the dynamic, instantaneous phase error and the smaller the apparent signal to noise ratio. This effect occurs in both transmitter and receiver amplifiers or other signal processors which are subject to such phase errors.

While the phase errors and the compensation provided by the present invention are described herein primarily in terms of QPSK, those of skill in the art will appreciate that the principles taught herein apply to other than QPSK, and that the use of quadrature signals and phase shift keying for purposes of illustration and explanation are not intended to be limiting.

Figure 4:
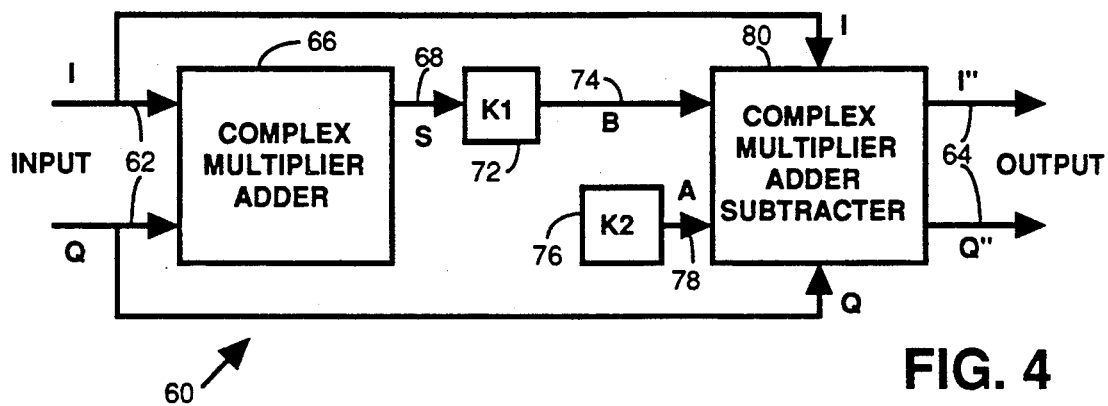
FIG. 4 is a simplified block diagram of a dynamic phase compensation system according to a preferred embodiment of the present invention.

FIG. 4 shows a block diagram according to a preferred embodiment of the present invention by which compensation of the phase error is achieved. Phase error compensator 60 receives uncompensated input signals 62 comprising, preferably, in-phase signal I and quadrature signal Q and provides compensated output signals 64 comprising compensated in-phase signal I" and compensated quadrature signal Q". The change between input signals 62 and output signals 64 provided by phase error compensator 60 is such as to substantially offset the predetermined phase error introduced by a subsequent signal processor and/or amplifier in a transmitter system or in a preceding signal processor or amplifier in a receiver, or to correct a distorted signal received from an uncompensated transmitter amplifier.

Phase error compensator 60 comprises complex multiplier 66 which received input signals I, Q and produces output signal 68 proportional to the sum of the amplitudes of I and Q, and which is scaled in block 72 by factor K1 which is determined from the amplifier phase-error versus power relationship, to produce output signal 74. Output signal 74, denoted herein as signal "B", varies according to the power level of the amplifier or signal processor which introduces the phase distortion.

Reference signal source 76 uses scaling factor K2 to produce output 78, denoted herein as signal "A". Signals A, B are combined in complex multiplier 80 with input signals I, Q, to produce summed output signals I", Q", according to the relations:

$I" = AQ + BI$, and $Q" = AI - BQ$, where the signals and indicated mathematical operations are understood to refer to complex variables.

Where the operating range of the amplifier is such that the phase error $\phi_e$ varies approximately linearly with amplifier power P, then $K1 = -C_1(d\phi_e/dP)$. Where the operating range of the amplifier is such that the phase error $\phi_e$ varies approximately linearly with the log of amplifier power P, then $K1 = -C_2(d\phi_e/d\log P)$. Where the relationship between $\phi_e$ and P is better approximated or represented exactly by another functional relationship, then that other functional relationship can be used to determine K1. In the preferred embodiment, $K2 = C_3$ is substantially a constant and corresponds to the $\cos \phi_e = 1$ terms for small phase error angles and $C_3$ is merely a magnitude adjustment factor.

Figure 5:
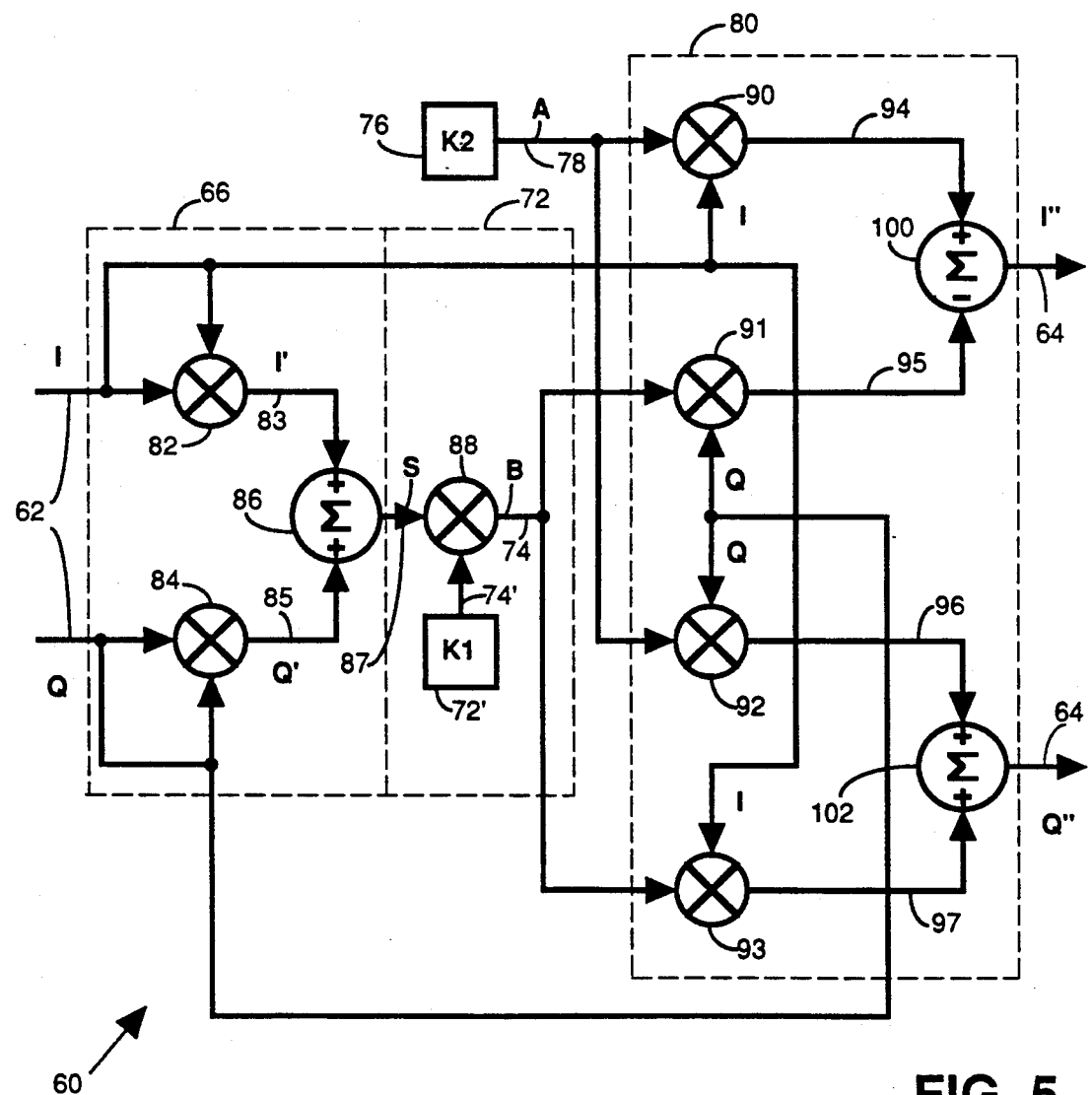
FIG. 5 is a simplified block diagram of a dynamic phase compensation system of FIG. 3 in greater detail.

FIG. 5 shows the phase error compensation system of FIG. 4 in more detail. The portions corresponding to the blocks in FIG. 4 are indicated by the dashed outlines.

In-phase input signal I flows to both inputs of multiplier 82 and quadrature input signal Q flows to both inputs of multiplier 84 whose outputs 83, 85 provide $I' = I^2$ and $Q' = Q^2$, respectively. I' and Q' are then summed in adder 86 whose output 87 corresponds to $S = I' + Q'$. The squaring and summing process removes all phase information from input signals I, Q so that output S of adder 86 is proportional to the power contained in input signals 62, that is $S = C_o P$ where $C_o$ is a proportionality constant.

While for the example shown here, $S = I' + Q' = I^2 + Q^2 = C_o P$, any variable which is monotonically related to the phase error $\phi_e$ may be used. For example, the absolute value of I and Q may be used, that is $S' = (I^2 + Q^2)^{\frac{1}{2}}$, with the appropriate proportionality constant and scaling factor $K1 = -C_4 d\phi_e/d([I + Q])$ where the square brackets indicate the absolute value $= (I^2 + Q^2)^{\frac{1}{2}}$, provided that the region of linear approximation is consistent with the desired operating range of the amplifier or signal processing system.

Output S from adder 86 is passed to multiplier 88 whose other input receives output 74' of factor generator 72', i.e., the factor K1 discussed above. K1 is obtained from measurement of the $\phi_e$ versus P response of the amplifier and/or signal processor introducing the distortion. $K1 = f(P)$ and, in the simplest and preferred implementation, is a predetermined constant for a particular amplifier operating over a range of $P = P_1$ to $P_2$. However, where the phase error is multivariant, e.g., $K1 = f(P,T)$ where T is temperature, the same arrangement can be used and will compensate for however many variables the generate phase error and can be measured and used to adjust K1 in real time, as for example, by determining $K1 = -(D_1(d\phi_e/dP) + D_2(d\phi_e/dT) + ...)$ for however many variables affect $\phi_e$, where the derivatives are partial derivatives.

Input signals I, Q and signals B and A are fed to inputs of complex multipliers 90-93 whose outputs are in turn fed to complex adders 100, 102, in the manner indicated in FIG. 5. Multiplier 90 receives input signal A from output 78 of factor generator 76 (K2) and input signal I from inputs 62, and provides complex product thereof 94 which is fed to one input of adder 100. Multiplier 91 receives input signal B from output 74 of multiplier 88 and input signal Q from inputs 62, and provides complex product thereof 95 which is fed to the other input of adder 100. Adder 100 is set to provide the difference of the complex signals presented at its inputs, that is, it functions as a complex "subtracter". This is indicated by the + and − signs appearing within the symbol of adder 100 in FIG. 5. The output of adder 100 is compensated output signal I".

Multiplier 92 receives input signal A from output 78 of factor generator 76 (K2) and input signal Q from inputs 62, and provides complex product thereof 96 which is fed to one input of adder 102. Multiplier 93 receives input signal B from output 74 of multiplier 88 and input signal Q from inputs 62, and provides complex product thereof 97 which is fed to the other input of adder 102. Adder 102 is set to provide the sum of the complex signals presented at its inputs. This is indicated by the + and + signs appearing within the symbol of adder 102 in FIG. 5. The output of adder 102 is compensated output signal Q". Multipliers 90-93 and adders 100, 102 are a preferred implementation of complex multiplier-summer 80 of FIG. 4.

Examples of suitable complex multipliers are the Type MPY534 Precision Analog Multiplier manufactured by Burr-Brown of Tucson, Ariz. and the Type 429 Analog Multiplier manufactured by Analog Devices, Inc. of Norwood, Mass., but other means for providing the indicated multiplications can also be used. High speed analog adders and subtracters (i.e., negative adders) are well known in the art.

The multipliers and adders operate in real time at the base band frequencies, i.e., the modulating signal frequencies. It is desirable that the circuits of FIGS. 4-5 be integrated since this tends to reduce the inter-element propagation times and result in overall faster operation. The general increase in performance of electronic circuits as a function of their level of integration is well known in the art. It is also desirable that the semiconductor technology used to implement the IC functions have high frequency capability. For example, it is believed that I, Q signalling bandwidths up to about 2-3 GigaHertz are possible using high speed semiconductor IC technology, such as for example the MOSAIC III ™ Technology developed by Motorola, Inc. (see for example, U.S. Pat. No. 4,837,176 - Zdebel et al.) or equivalent, to implement the circuit elements within dashed line 80 of FIG. 5 in a single silicon chip. The same chip with some inputs disabled or re-arranged could also implement the elements within dashed line 66 or within both dashed lines 66 and 72 of FIG. 5.

Figures 6A, 6B:
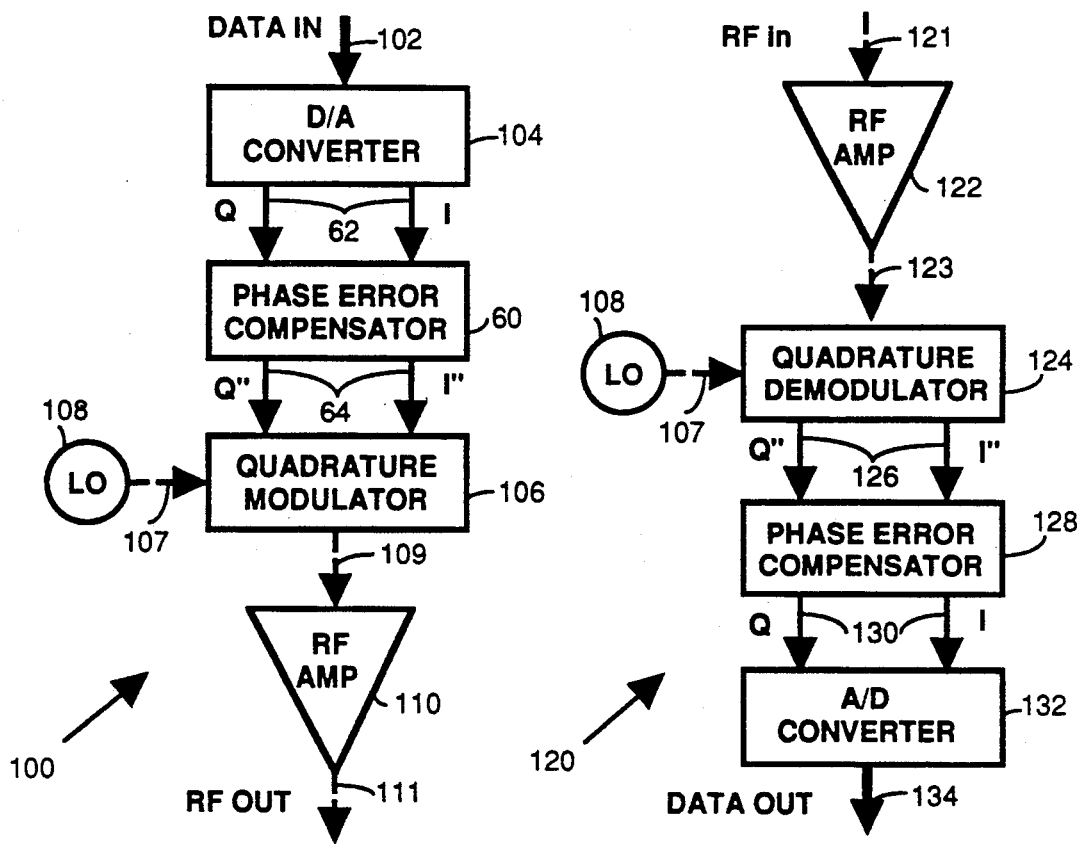
FIGS. 6A-B are simplified block diagrams of RF amplifying systems according to further embodiments of the present invention.

FIGS. 6A-B show further embodiments of the present invention in which the above-described phase error compensator is incorporated in an amplifier or transmitter (FIG. 6A) and in a receiver (FIG. 6B). Referring to FIG. 6A, digital input data 102 is provided to D/A converter 104 which provides quadrature I, Q signals 62 to phase error compensator 60. Phase error compensator 60 provides compensated I", Q" signals 64 to quadrature modulator 106 which also receives the carrier signal 107 from local oscillator 108. Modulated RF signal 109 is provided from modulator 106 to RF amplifier or signal processor 110 which is the known source of phase distortion.

As has been previously described in connection with FIGS. 4-5, compensator 60 provides signals I", Q" having phase distortion which is substantially equal and opposite to that which is introduced into the modulation of RF signal 109 by RF amplifier or signal processor 110, so that the phase distortion in RF signal 110 being sent to the antenna (or cable or other transmission medium) is substantially reduced or eliminated.

FIG. 6B shows receiver 120 which receives modulated RF signal 121 which is fed to RF amplifier 122 to provide amplified RF signal 123 to quadrature demodulator 124. Demodulator 124 produces distorted I", Q" signals 126, where in this instance the double primes on I and Q indicate that the signals already carry with them the amplifier induced distortion. The amplifier induced distortion may result from distortion introduced by amplifier 122 which is part of the receiver or from an amplifier located earlier in the transmission path, as for example, an amplifier in an uncompensated transmitter. It does not matter where the amplifier is located so long as the distortion inducing behavior of the amplifier and the appropriate values of K1 and K2 are known so that they can be utilized in compensator 128. Compensator 128 receives distorted I", Q" signal 126 in much the same way as phase error compensator 60 of FIGS. 4-5 receives error free input signals I, Q and, through substantially the same process described in connection with FIGS. 4-5, determines the power level and applies factors K1, K2 of the appropriate sign to produce compensated I, Q output signals 130 from which the predetermined distortion introduced by amplifier 123 has been cancelled. The recovered distortion free I, Q signals 130 are fed to A/D converter 132 which provides corrected data output 134.

The efficacy of the above-described phase error compensator was tested by computer simulation for an amplifier, e.g., amplifier 110, having a phase error versus power response of 0.5 degree/db, i.e., K1 = −0.5 °/db. Octal Phase Shift Keying (OPSK or 8PSK) modulation was assumed. The simulated system was similar to FIGS. 6A but with a simulated distortion free receiver to recover the digital data. Error free digital data stream 102 was converted in equivalent D/A converter 104 to I, Q signals 62 and then passed through equivalent phase error compensator 60 and equivalent modulator 106, in this case a OPSK modulator. The modulated RF signals was then sent to equivalent distortion inducing RF amplifier 110 to produce compensated RF output 111. RF output 111 was then demodulated and passed through an A/D converter to recover the digital data. The recovered digital data was then compared to input digital data 102 and the probability of a bit error determined as a function of the amplifier power level.

Figure 7:
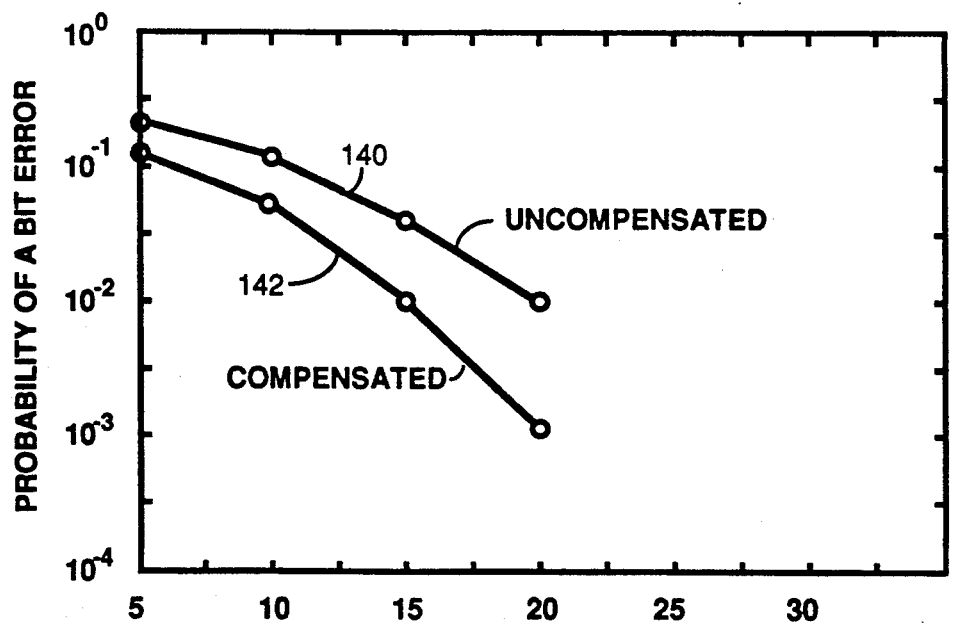
FIG. 7 is a comparison plot of the probability of a data bit error (PE) versus signal to noise ratio in db for an uncompensated amplifier system and an amplifier system compensated according to the present invention.

The results of this test are shown in FIG. 7 which plots the probability of a bit error against the signal to noise ratio. Curve 140 shows the bit error probability associated with the uncompensated system, that is, the bit error probability when compensator 60 is bypassed and I, Q fed directly to modulator 106. Curve 142 shows the bit error probability when compensator 60 is utilized. It is observed that there is a substantial reduction in the bit error probability at the same signal to noise ratio. For example, on the average at a signal to noise ratio of 20 db, one bit error will be introduced in every 100 bits with the uncompensated system, while with the compensated system one bit error will be introduced in every 1000 bits, an order of magnitude improvement. Looked at another way, for the same bit error probability, e.g. 1%, a S/N ratio of 15 db with the compensated system, produces the same performance as a S/N ratio of 20 db with the uncompensated system. There is a 5 db improvement in system performance as a result of using the invented compensation system and method. This is an important advantage, particularly in satellite applications where weight and space are severely limited and it has been common to run TWT amplifiers and other signal processors at well below their rated power levels in order to avoid substantial distortion. With the present invention, the operating power level of the apparatus can be increased without such substantial bit error penalty.

Based on the foregoing description, it will be apparent to those of skill in the art that the present invention solves the problems and achieves the goals set forth earlier, and has substantial advantages as pointed out herein, namely, it is particularly simple to implement and is capable of functioning at high data rates since it does not depend upon making any real time measurements of the actual amplifier distortion characteristics, this having been determined ahead of time. Rather it only requires that the power level of the signal being amplified or already amplified be determined and combined with the incoming signal frequency in the indicated manner, which can be done at a high rate in real time using, for example, semiconductor integrated circuit complex multipliers and adders/subtracters. Substantial improvement in the useable power is obtainable with RF signal processing apparatus, such as for example TWT's and other types of RF amplifiers, since the amplifier can be run at a much higher power level for the same bit error rates. The invented means and method substantially reduces distortion and bit errors in coherent phase modulated signalling systems.

While the present invention has been described in terms of particular materials, structures and steps, these choices are for convenience of explanation and not intended to be limiting. For example, while QPSK is a preferred signalling arrangement, OPSK, QAM and other schemes may equally well be used in connection with the present invention. Further, while the present invention has been described as being particular useful in improving the performance of TWT amplifiers, it will be readily apparent to those of skill in the art based on the teachings herein, that other signal processing apparatus can also be used provided that it has predeterminable distortion characteristics. As those of skill in the art will understand based on the description herein, the present invention applies to other choices of materials, arrangements and process steps, and it is intended to include in the claims that follow, these and other variations as will occur to those of skill in the art based on the present disclosure.

We claim:

1. A phase compensation apparatus, comprising:
   first signal processing means providing a first output signal (I') proportional to a first input signal (I) being provided thereto;
   second signal processing means providing a second output signal (Q') proportional to a second input signal (Q) being provided thereto;
   third signal processing means coupled to outputs of the first and second signal processing means for providing a third output signal (B) proportional to the sum of the first (I') and second (Q') output signals; and
   fourth signal processing means receiving the first (I) and second (Q) input signals and the third output signal (B) and a fourth signal (A) and producing a fifth output signal (Q") proportional to a difference of a product of the fourth signal (A) and the first input signal (I) and a product of the third output signal (B) and the second input signal (Q), and producing a sixth output signal (I") proportional to a sum of a product of the fourth signal (A) and the second input signal (Q) and a product of the third output signal (B) and the first input signal (I).

2. The phase compensation apparatus of claim 1 wherein the first (I) and second (Q) input signals are substantially in quadrature.

3. The phase compensation apparatus of claim 1 wherein the first (I) and second (Q) input signals are complex signals, having predetermined amplitude and phase.

4. The phase compensation apparatus of claim 1 further comprising modulating means for modulating the fifth (I") and sixth (Q") output signals onto a carrier provided by a local oscillator coupled to the modulating means.

5. The phase compensation apparatus of claim 1 wherein the third signal processing means comprises a first summing means for adding the first (I') and second (Q') output signals to provide a summed output (S) and further signal processing means for receiving the summed output (S) and producing the third output signal (B) proportional to the summed output (S).

6. The phase compensation apparatus of claim 5 wherein the first and second signal processing apparatus comprise means for determining the amplitudes of the first (I) and second (Q) input signals.

7. A method for phase compensation, comprising:
   obtaining a sum (S) of first (I') and second (Q') real values proportional to the amplitudes of first (I) and second (Q) complex quadrature input signals;
   adjusting the value of the sum (S) by an amount dependent on a factor (K) proportional to the phase distortion introduced by a subsequent amplifying means, to obtain an amplitude dependent distortion factor (B);
   providing a reference signal (A); and
   complex multiplying and summing the first (I) and second (Q) input signals and the distortion factor (B) and the reference signal (A) to provide first (I") and second Q") complex quadrature output signals, wherein (I") equals a sum of a product of the reference signal (A) and the second complex quadrature input signal (Q) and a product of the distortion factor (B) and the first complex quadrature input signal (I), and wherein (Q") equals a difference of a product of the reference signal (A) and the first complex quadrature input signal (I) and a product of the distortion factor (B) and the second complex quadrature input signal (Q).

8. The method of claim 7 further comprising modulating an RF carrier with the first (I") and second (Q") complex quadrature output signals.

9. The method of claim 7 wherein the adjusting step comprises obtaining (B) as a product of the factor (K) and the sum (S).

10. The method of claim 9 further comprising passing the modulated RF carrier through the amplifying means whose amplitude dependent phase distortion factor $K' = -K$.

11. The method of claim 7 wherein the step of obtaining the sum (S) comprises multiplying the first (I) input signal by itself and multiplying the second (Q) input signal by itself to obtain the first (T') and second (Q') real values and then summing the first (T') and second (Q') real values to obtain the sum (S).

* * * * *

UNITED STATES PATENT AND TRADEMARK OFFICE
CERTIFICATE OF CORRECTION

PATENT NO. : 5,111,155

DATED : May 5, 1992

INVENTOR(S) : Christopher R. Keate et al.

It is certified that error appears in the above-identified patent and that said Letters Patent is hereby corrected as shown below:

In column 10, claim 11, lines 62 and 63, the "(T')" in both lines should be --(I')--.

Signed and Sealed this

Twenty-fifth Day of May, 1993

Attest:

MICHAEL K. KIRK

Attesting Officer

Acting Commissioner of Patents and Trademarks